United States Patent [19]
Birkner et al.

[11] Patent Number: 5,605,428
[45] Date of Patent: Feb. 25, 1997

[54] DEVICE FOR INDEXING MAGAZINE COMPARTMENTS AND WAFER-SHAPED OBJECTS IN THE COMPARTMENTS

[75] Inventors: Andreas Birkner; Berndt Lahne; Klaus Schultz, all of Jena, Germany

[73] Assignee: Jenoptik GmbH, Jena, Germany

[21] Appl. No.: 331,523

[22] PCT Filed: Mar. 3, 1993

[86] PCT No.: PCT/EP94/00620

§ 371 Date: Nov. 3, 1994

§ 102(e) Date: Nov. 3, 1994

[87] PCT Pub. No.: WO94/20979

PCT Pub. Date: Sep. 15, 1994

[30] Foreign Application Priority Data

Mar. 5, 1993 [DE] Germany ............. 43 06 957.6

[51] Int. Cl.⁶ ........................................ H01J 40/14
[52] U.S. Cl. .................. 414/331; 414/416; 414/934; 250/559.36
[58] Field of Search .................... 414/273, 275, 414/331, 416, 937; 250/559.29, 559.36, 559.37

[56] References Cited

U.S. PATENT DOCUMENTS

| | | | |
|---|---|---|---|
| 3,902,615 | 9/1975 | Levy et al. | 414/331 |
| 4,458,152 | 7/1984 | Bonara | 414/331 |
| 4,765,793 | 8/1988 | Goddeau | 414/416 |
| 4,803,373 | 2/1989 | Imamura . | |
| 4,895,486 | 1/1990 | Baker et al. . | |
| 4,954,721 | 9/1990 | Suzuki | 414/331 |
| 4,996,436 | 2/1991 | Doeuvne et al. | 414/416 |
| 5,003,188 | 3/1991 | Igasi | 414/937 |
| 5,044,752 | 9/1991 | Thurfjell . | |
| 5,291,025 | 3/1994 | Smith | 250/559.36 |

FOREIGN PATENT DOCUMENTS

| | | | |
|---|---|---|---|
| 273441 | 3/1986 | Japan | 414/331 |
| 106641 | 5/1987 | Japan | 414/331 |
| WO92/05920 | 4/1992 | WIPO . | |

*Primary Examiner*—Karen B. Merritt
*Assistant Examiner*—Thomas J. Brahan
*Attorney, Agent, or Firm*—McAulay Fisher Nissen Goldberg & Kiel, LLP

[57] ABSTRACT

A device for indexing magazine compartments of a magazine and wafer-shaped objects contained therein to ensure precise access of the removing and charging device in any given predetermined plane of the magazine regardless of dimensional tolerances. An optoelectronic sensor having a transmitter and receiver emits a bundle of measurement rays to detect the position of the wafer-shaped objects as well as the position of the magazine compartments relative to a reference plane whose location is rigidly defined by design with respect to a first handling plane for removing and charging. The magazine is adjustable vertically in a measurable manner for removal and charging by a magazine seat via a magazine lift. The device is applicable in the manufacture of integrated circuits, in particular for handling wafer-shaped objects.

2 Claims, 4 Drawing Sheets

DEVICE FOR INDEXING MAGAZINE COMPARTMENTS AND WAFER-SHAPED OBJECTS IN THE COMPARTMENTS

BACKGROUND OF THE INVENTION a) Field of the Invention

The present invention is directed to a device for indexing magazine compartments and wafer-shaped objects contained therein, particularly semiconductor wafers and templates, the magazine being adjustable vertically in a measurable manner relative to a handling plane for removal and charging by a magazine seat of a wafer handling device by means of a magazine lift for the purpose of processing such wafer-shaped objects. Such technical solutions can be applied in the manufacture of integrated circuits, particularly for handling operations, and are known, for example, from U.S. Pat. No. 4,895,486.

b) Description of the Related Art

In the manufacture of integrated circuits, semiconductor wafers must be transported between different processing stages to individual processing machinery. It is increasingly common for such transport to be effected in standardized transport containers, so-called standard mechanical interface boxes (SMIF boxes), the magazine within whose compartments the semiconductor wafers are located being fastened in a suitable manner to the base of these transport containers. For the purpose of charging the processing machines, the magazines are unloaded from the transport containers by suitable devices and the semiconductor wafers are removed by a removing and charging device. After processing, the semiconductor wafers are returned to the compartments of the magazine and the magazine is returned to the transport containers.

The possible use of impact pressure sensors or reflex couplers which detect the semiconductor wafers in the magazine has the disadvantage that the magazine must be serviced in a determined sequence. In so doing, the semiconductor wafers may not be removed from the magazine in arbitrary sequence; rather, the charging magazine must be emptied starting from the bottom and proceeding upward and the dispensing magazine must be filled starting from the top and proceeding downward because of the required sensor arrangement and the removal and charging of semiconductor wafers dictated thereby. Consequently, a fixed allocation of the wafer to a determined level is not adhered to. Such technical solutions cannot be applied for inspecting conventional random samples or for use in the above-mentioned transport containers.

It is known from U.S. Pat. No. 4,895,486 to determine the presence of wafer-like objects in a carrier (magazine) and their position relative to a reference plane in the carrier by means of a monitoring device in that a first signal reporting the presence of such an object is combined with a position signal for the object. The first signal is obtained by an optoelectronic sensor which monitors the space in which the objects can be located. The second signal is formed via a position encoder coupled with a drive for moving the carrier up and down.

To determine the reference plane and possible location of the objects, the carrier space is divided vertically into segments. In addition to a segment serving as reference plane and segments without wafer-like objects, window segments in which objects may be present are also defined. An indexing of the carrier is effected in that, after the reference plane in the carrier is detected by measuring techniques, the locations of the window segments are determined by computer based on construction data of the respective carrier being used and are stored in the computer.

Although the quantity of objects and their locations relative to a reference plane within the carrier can be determined by means of the described solution, the carrier or the removing and charging device must be positioned according to the grid dimensions of the compartments of the carrier in order to remove the objects from the carrier. If divergent carrier geometries and tolerances are not allowed for in so doing, errors cannot be ruled out. In particular, problems arise in optional charging of empty carriers.

Further, it is possible to monitor the correct position of the object in the carrier by means of an additional optoelectronic sensor when the carrier is being transported upward in the vertical direction. In this way, objects protruding from the carrier as the result of faulty or incorrect handling are protected against damage when being returned to the transport containers. If an object protruding from the carrier is detected, the transport of the magazine is stopped and manual intervention on the part of the operator is required to correct the error.

While the detection of protruding objects has practical importance, the required manual intervention causes unnecessary delays in continued processing by interfering with the sterile conditions and possibly the climatic conditions of the processing machines within the machine enclosure. This can result in failure of the machine.

Therefore, the problem to be solved consists in ensuring that the removing and charging device can precisely access any given and predetermined plane of the magazine independent of dimensional tolerances so as to avoid the costs involved in extra adjustments and to provide for a more flexible use of the described transport containers. Moreover, it must be ensured that operation may be resumed immediately when detecting incorrectly positioned semiconductor wafers.

SUMMARY OF THE INVENTION

In a device for indexing magazine compartments and wafer-shaped objects, in particular semiconductor wafers and templates, contained therein in which the magazine is adjustable vertically in a measurable manner relative to a first handling plane for removal and charging by a magazine seat of a wafer handling device by means of a magazine lift for the purpose of processing such wafer-shaped objects, which device includes an optoelectronic sensor having a transmitter and receiver which detects the position of the wafer-shaped object relative to a reference plane via a bundle of measurement rays, the above-mentioned problem is solved according to the invention in that the bundle of measurement rays also detects the position of the magazine compartments relative to the reference plane whose location in the wafer handling device is rigidly defined by design with respect to the first handling plane.

The bundle of measurement rays which is emitted by the transmitter and whose middle ray lies in the reference plane is guided between opposite walls enclosing the magazine compartments and is directed on projections of one of the walls, which projections are directed toward the interior of the magazine and from compartments serving to support the wafer-shaped objects and interrupt the bundle of measurement rays. As a result of the vertical adjustment in the direction of the magazine compartments which are located one above the other and which accordingly successively occupy a position in common with the reference plane, an image of the magazine compartments and of the wafer-shaped objects contained therein is produced by modulating the bundle of measurement rays.

An individual sensor system employs measuring techniques to detect the magazine compartments themselves and the objects contained therein so as to determine the actual ratios, in contrast to devices in which the position of a magazine compartment is determined by computer based on constructional data or by means of an indexer measuring scale. In this way, objects may be removed and restored in any optional manner so that it is also possible to carry out any type of re-sorting or rearrangement between magazines in which the spacing of the compartments differs from one magazine to another and with respect to a reference plane within the magazine. Empty magazines can also be filled in any given manner.

In order to position wafer-like objects protruding from the magazine, a wafer returning device is provided in a second handling plane parallel to the first handling plane. The actuation of the wafer returning device is contingent upon a sensor signal of a second sensor whose bundle of measurement rays is directed parallel to the wafer-shaped objects and lies directly adjacent to the removal and charging side of the magazine during the vertical adjustment of the magazine.

When triggered by the sensor signal, the wafer returning device guides the object back into the magazine compartment without external intervention. Without manual intervention, continued transport of the magazine in the transport containers is ensured and damage to protruding objects is prevented.

The invention will be explained more fully in the following with reference to the schematic drawing.

DESCRIPTION OF THE PREFERRED EMBODIMENTS

Figure 1:
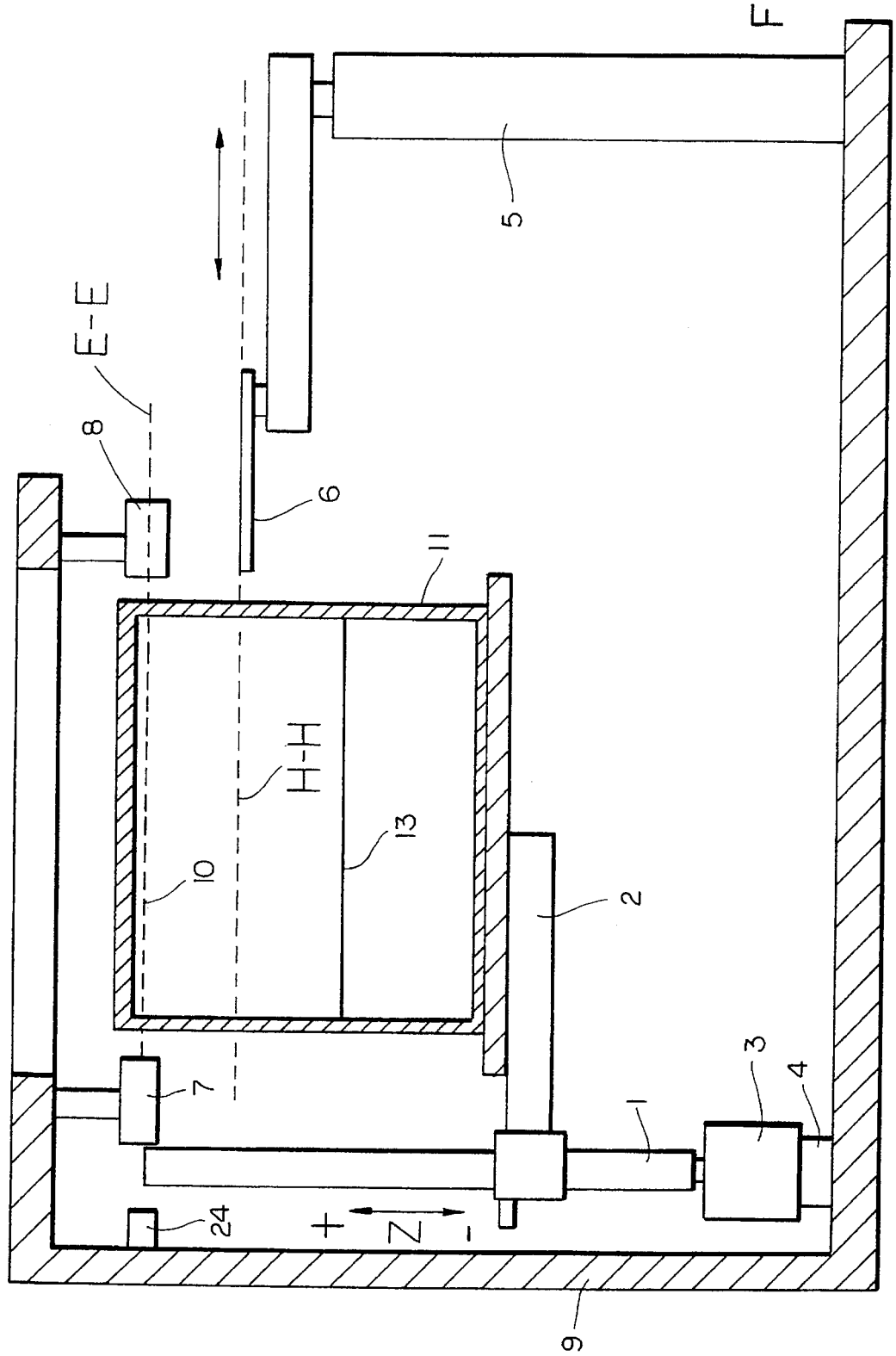
FIG. 1 shows a part of a wafer handling device in partial section.

A wafer handling device, only pan of which is shown in FIG. 1, contains in its interior a magazine seat 2 which can be raised and lowered in the z direction (vertically to the supporting surface of the wafer handling device) via a spindle drive 1. The spindle 1 is driven by a stepper motor 3 which is outfitted with an angle measuring system 4 so that the distance traversed when raised or lowered can be determined via the slope of the spindle.

Figure 6:
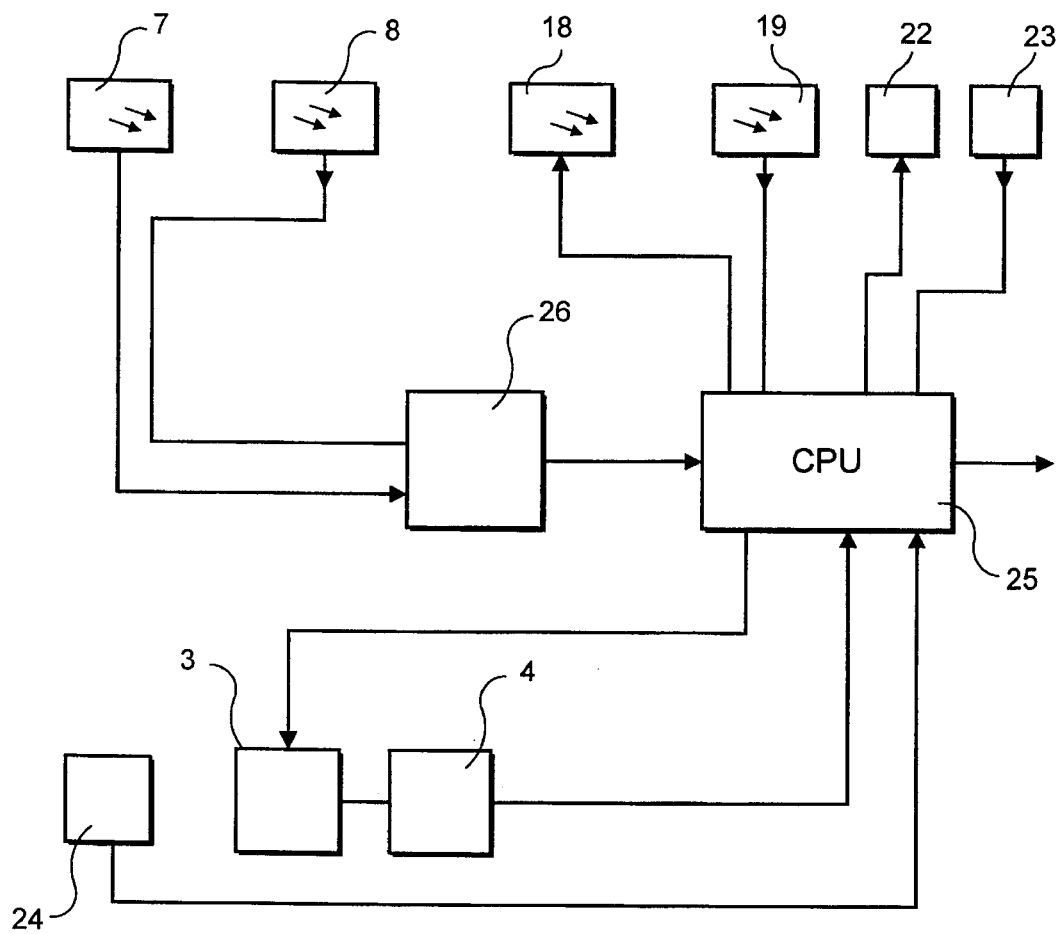
FIG. 6 is a block diagram showing the interconnection of the control unit, processing unit and evaluating unit with other units for carrying out the invention.

Together with a control computer 25 according to FIG. 6, the stepper motor 3 with its control electronics and angle measuring system 4 forms a position regulator of a magazine lift which also includes the spindle 1 and magazine seat 2. A removing and charging device 5 has a manipulating arm 6 working in a handling plane H—H and is fastened to a frame 9 along with the magazine lift and an optoelectronic sensor comprising a transmitter 7 and a receiver 8. A bundle 10 of measurement rays emitted by the transmitter 7 lies with its middle ray in a reference plane E—E for indexing magazine compartments 12 located in a magazine 11 and wafer-shaped objects 13 contained therein. For the sake of simplicity, the magazine compartments 12 are first shown in FIG. 3. The distance between plane E—E and handling plane H—H can be selected within the range of travel of the spindle drive 1.

Figure 2:
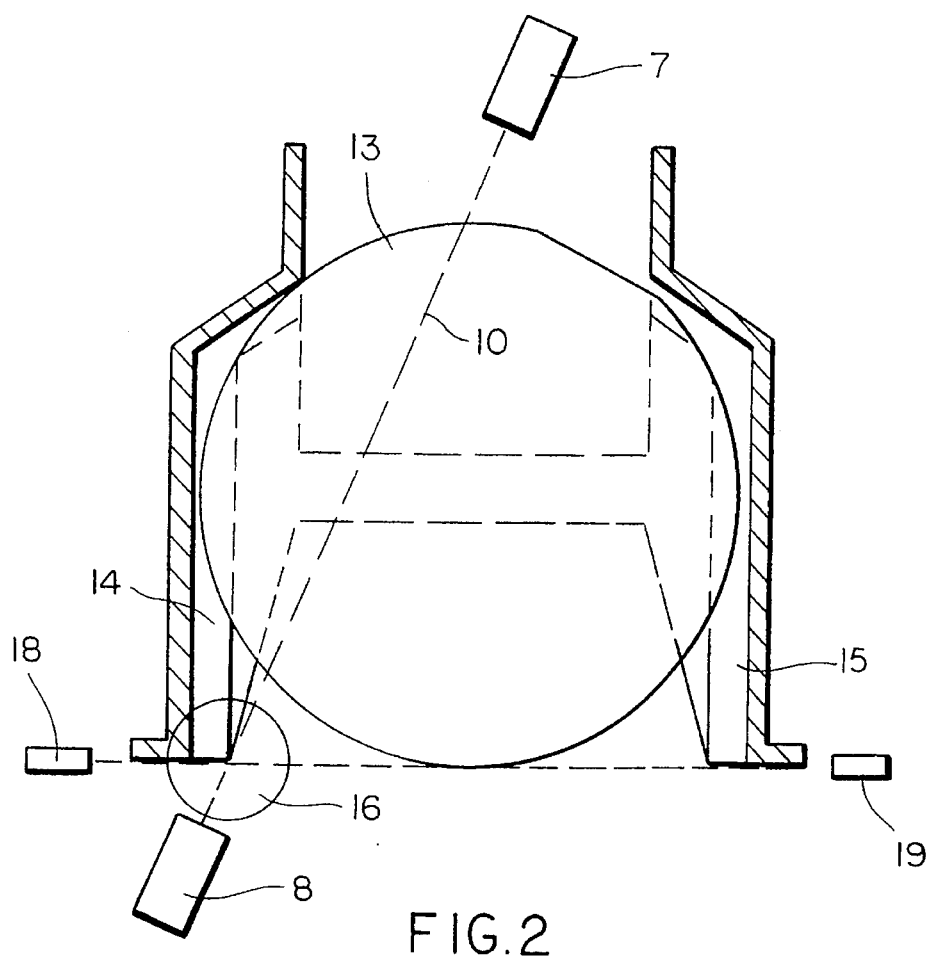
FIG. 2 shows the arrangement of an optoelectronic sensor in a sectional view through the magazine.
Figure 3:
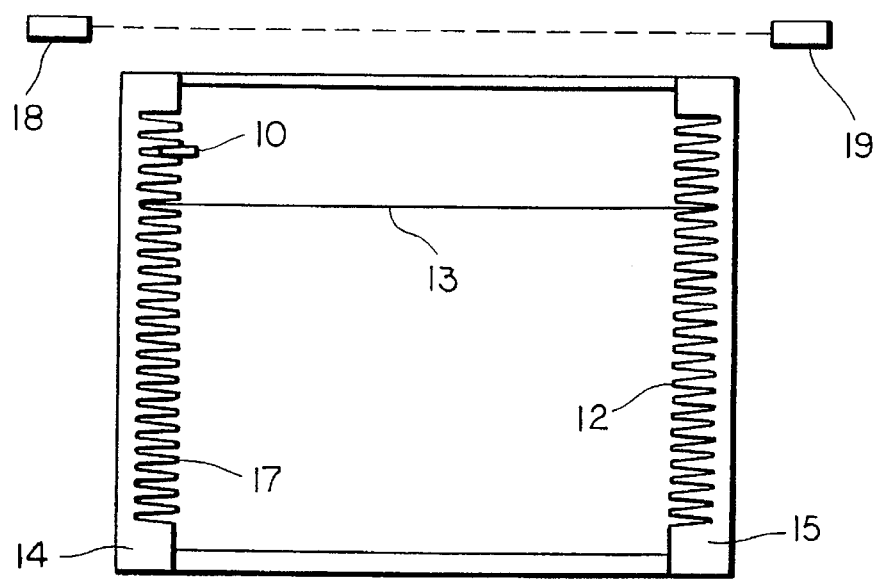
FIG. 3 shows the front view of a magazine with cross-sectional view of a bundle of measurement rays.

FIGS. 2 and 3 show the arrangement of the sensor with reference to the magazine 11 and wafer-shaped objects 13, e.g. semiconductor wafers or templates, which may be located in the magazine compartments 12. The transmitter 7 and the receiver 8 are correspondingly situated in such a way that the bundle 10 of measurement rays is guided between walls 14, 15 of the magazine 11 and directed on a corner portion 16. According to FIG. 4, the corner portion 16 extends far enough into the bundle 10 of measurement rays so that projections 17 facing the interior of the magazine 11 and serving as supports for the wafer-shaped objects 13 interrupt the bundle 10 of measurement rays.

The oblique irradiation of the magazine 11 shown in the drawing was chosen because the magazine 11 is usually partially closed in the rear. Naturally, in the absence of such closure, the bundle 10 of measurement rays could also be guided parallel to the walls 14 and 15 and magazine compartments 12. The middle ray of the bundle 10 of measurement rays advantageously passes directly along the front edge of the projections 17.

In addition to the first sensor, another sensor having a transmitter 18 and a receiver 19 is arranged adjacent to the magazine 10 on its removal and charging side (the side facing the removing and charging device 5). This sensor is situated at a defined distance from the first sensor and detects objects 20 protruding from the magazine 11 when the magazine 11 is transported in the positive z direction.

Figure 5:
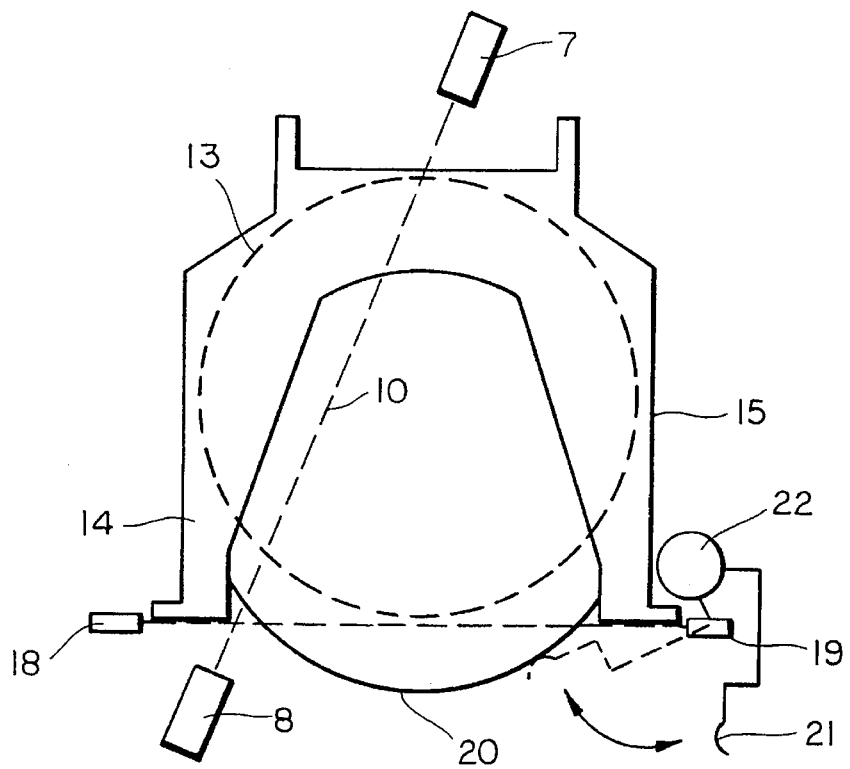
FIG. 5 shows a top view of the magazine with a second sensor and a wafer returning device.

As shown in FIG. 5, a wafer returning device 21 is provided for positioning the object 20 protruding from the magazine 11. The water returning device 21 takes over the displacement of the object 20 in the magazine 11 in a second handling plane parallel to the first handling plane H—H on the basis of the position information obtained by the first sensor. In this way, transport of the magazine 11 can proceed without interference and without manual intervention.

The wafer returning device 21 has a lever mechanism 22 which is driven by an electric motor and executes a swiveling movement of 90° with each revolution of its drive (not shown). The lever of mechanism 22 is arranged in such a way that the lever pushes the object 20 into the magazine 11 and then returns to an initial position which is monitored by a limit switch 23.

As is shown in FIG. 6, the stepper motor 3, angle measuring system 4, transmitters 7 and 18, receivers 8 and 19, a third sensor 24 rigidly connected with the frame 9, the lever mechanism 22, and the limit switch 23 are connected with a control computer 25 for carrying out the invention. Analog-to-digital converters, only one of which 26 is shown, are connected between the sensors and the control computer 25.

When the magazine seat 2 is positioned relative to the third sensor 24, which is rigidly connected with the frame 9 and at a known distance relative to handling plane H-H and reference plane E—E, and after the counter of the angle measuring system has been reset to zero, the magazine 11 is automatically removed by its base from a dust-proof transport container, not shown, and is taken over by the magazine seat 2 for indexing the magazine compartments 12 and the wafer-shaped objects 13 located therein. The magazine seat 2 is then lowered, i.e. moved in the negative z direction, until exceeding a threshold value sw2 of threshold values sw1 and sw2 which are advantageously determined for the purpose of data reduction. In this way, the distance of the base of the magazine 11 from the reference plane E—E is detected.

Figure 4:
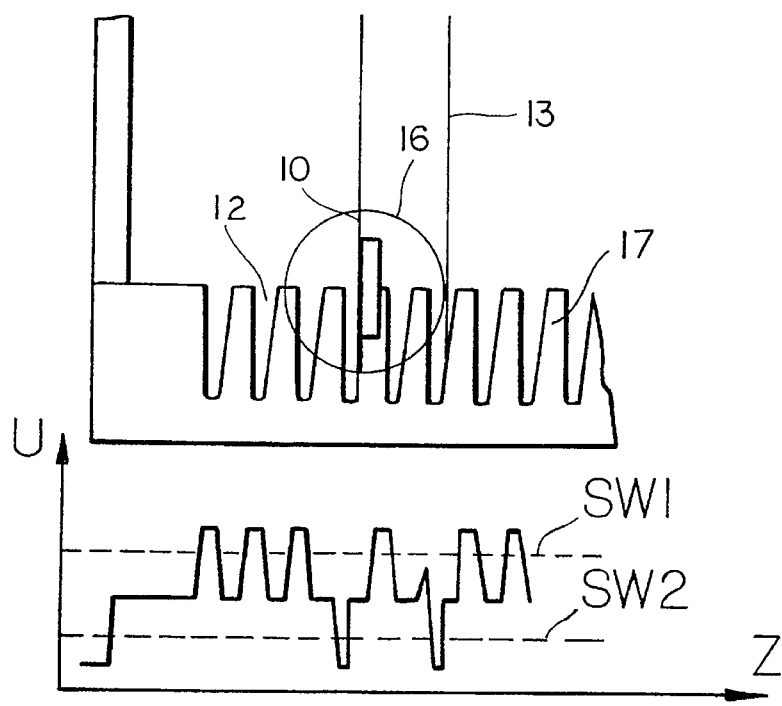
FIG. 4 shows, respectively, a section of one of the walls of the magazine with inserted wafer-shaped objects and an image of the section scanned by means of the optoelectronic sensor.

As the magazine 11 moves through plane E—E in the direction of its compartments 12, which are located one above the other, an amplitude-modulated sensor output signal U representing the magazine compartments 12 and objects 13 as an image is obtained at the receiver 8 as a function of distance corresponding to FIG. 4 and is fed to the analog-to-digital converter 26 and combined with the measurement signal of angle measuring system 4 and stored by means of the control computer 25.

In order to remove an object 13 from the magazine 11 or to place it in an empty magazine compartment 12, a value for the distance between plane E—E and the first handling plane H—H is added to the determined counter reading and the magazine 11 is moved into the corresponding z position by means of the magazine lift.

Naturally, if permitted by the environmental conditions under which the wafer-shaped objects 13 are transported, special protective transport containers of the type mentioned above may be omitted. In this special case, the magazine seat 2 takes over the magazine directly without transfer from the transport container.

While the foregoing description and drawings represent the preferred embodiments of the present invention, it will be obvious to those skilled in the art that various changes and modifications may be made therein without departing from the true spirit and scope of the present invention.

What is claimed is:

1. In a device for indexing compartments of a magazine and wafer-shaped objects contained in said compartments, said magazine being movable in a vertical direction relative to a first handling plane by a magazine lift to allow removal and charging of said wafer-shaped objects for the purpose of processing said wafer-shaped objects, said device comprising:

optoelectronic sensor means including transmitter means and receiver means for detecting the position of a wafer-shaped object relative to a reference plane via a bundle of measurement rays, said bundle of measurement rays also being used for detecting a position of said magazine compartments relative to said reference plane whose location in the device is rigidly defined by design with respect to the first handling plane; wherein opposite walls are provided defining said magazine compartments, said walls having projections, the bundle of measurement rays which is emitted by said transmitter means has a middle ray which lies in said reference plane and is guided between said opposite walls defining said magazine compartments and is directed on said projections of one of the walls, said projections being directed toward the interior of the magazine and forming magazine compartments serving to support the wafer-shaped objects and to interrupt the bundle of measurement rays, so that, as a result of vertical adjustment in the direction of the magazine compartments which are located one above the other and which successively occupy a position in common with the reference plane, an image of the magazine compartments and of the wafer-shaped objects contained therein is produced by modulating the bundle of measurement rays, and wafer returning means are provided in a second handling plane parallel to the first handling plane for positioning wafer-like objects protruding from the magazine, said wafer returning means being actuated depending upon a sensor signal of a second sensor means whose bundle of measurement rays is directed to seated wafer-shaped objects and directly adjoins the removal and charging side of the magazine during vertical adjustment of the magazine.

2. A wafer handling apparatus comprising:

a magazine having compartments therein;

a magazine lift having a magazine seat for vertically adjusting the position of the magazine relative to a first handling plane for removal and charging wafer-shaped objects for the purpose of processing said objects; and optoelectronic sensor means, including means for transmitting and means for receiving a bundle of measurement rays for detecting the position of said wafer-shaped objects relative to a reference plane and for detecting the position of said magazine compartments relative to said reference plane;

wherein said magazine has opposing walls for enclosing the magazine compartments, said walls have projections therein, said transmitting means emits a bundle of rays wherein a middle ray of said bundle lies in said reference plane and is guided between said opposite walls enclosing the magazine compartments and is directed on said projections of one of the walls, said projections being directed toward the interior of the magazine and forming compartments serving to support the wafer-shaped objects and to interrupt the bundle of measurement rays, so that, as a result of vertical adjustment in the direction of the magazine compartments which are located one above the other and which successively occupy a position in common with the reference plane, an image of the magazine compartments and of the wafer-shaped objects contained therein is produced;

wherein said wafer handling apparatus further includes a second sensor means including transmitter means and receiver means and wherein wafer returning means are provided in a second handling plane parallel to the first handling plane for positioning wafer-shaped objects protruding from the magazine, which means are actuated depending upon a sensor signal of second sensor means, said second sensor means utilizing a bundle of measurement rays which is directed parallel to seated wafer-shaped objects and directly adjoins the removal and charging side of the magazine during vertical adjustment of the magazine.

* * * * *

UNITED STATES PATENT AND TRADEMARK OFFICE
CERTIFICATE OF CORRECTION

PATENT NO. : 5,605,428

DATED : February 25, 1997

INVENTOR(S) : Andreas BIRKNER, et al

It is certified that error appears in the above-indentified patent and that said Letters Patent is hereby corrected as shown below:

On the title page, item [22], change "1993" to --1994--.

Signed and Sealed this

Eighth Day of July, 1997

Attest:

BRUCE LEHMAN

Attesting Officer

Commissioner of Patents and Trademarks